(12) United States Patent
Nomaguchi

(10) Patent No.: US 7,553,774 B2
(45) Date of Patent: Jun. 30, 2009

(54) METHOD OF FABRICATING SEMICONDUCTOR OPTICAL DEVICE

(75) Inventor: Toshio Nomaguchi, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 12/068,558

(22) Filed: Feb. 7, 2008

(65) Prior Publication Data
US 2008/0200004 A1 Aug. 21, 2008

(30) Foreign Application Priority Data
Feb. 7, 2007 (JP) .......................... P2007-028471

(51) Int. Cl.
*H01L 21/302* (2006.01)
*H01L 21/461* (2006.01)
(52) U.S. Cl. .................. 438/725; 438/723; 438/724; 438/933; 257/E21.17; 257/E21.117; 257/E21.118; 257/E21.134; 257/E21.229; 257/E21.217; 257/E21.267
(58) Field of Classification Search ............ 438/725, 438/603, 604, 606, 680, 681, 706, 745, 723, 438/724, 671, 728, 933, 769
See application file for complete search history.

(56) References Cited

U.S. PATENT DOCUMENTS

| 5,527,730 A | * | 6/1996 | Kayaoka et al. ............. 438/256 |
| 5,548,129 A | * | 8/1996 | Kubena ..................... 257/24 |
| 5,581,116 A | * | 12/1996 | Nakatsu ...................... 257/623 |
| 5,963,812 A | * | 10/1999 | Kataoka et al. ............. 438/304 |
| 6,242,327 B1 | * | 6/2001 | Yokoyama et al. .......... 438/507 |
| 6,638,873 B2 | * | 10/2003 | Furukawa ................... 438/706 |
| 6,911,351 B2 | * | 6/2005 | Kidoguchi et al. ........... 438/46 |

FOREIGN PATENT DOCUMENTS

JP 10-64781 3/1998

* cited by examiner

*Primary Examiner*—David Nhu
(74) *Attorney, Agent, or Firm*—Smith, Gambrell & Russell, LLP

(57) ABSTRACT

In a method of fabricating a semiconductor optical device, insulating structures for an alignment mark for use in electron beam exposure are formed on a primary surface of a first group III-V semiconductor region. After forming the insulating structures, a second group III-V semiconductor region is grown on the first group III-V semiconductor region to form an epitaxial wafer. The height of the insulating structures is larger than thickness of the second group III-V semiconductor region. After forming the second group III-V semiconductor region, alignment for the electron beam exposure is performed. After the alignment, a resist is exposed to an electron beam to form a resist mask. The resist mask has a pattern for a diffraction grating, and the resist is on the epitaxial wafer.

20 Claims, 6 Drawing Sheets

Fig.1
(a)
(b)
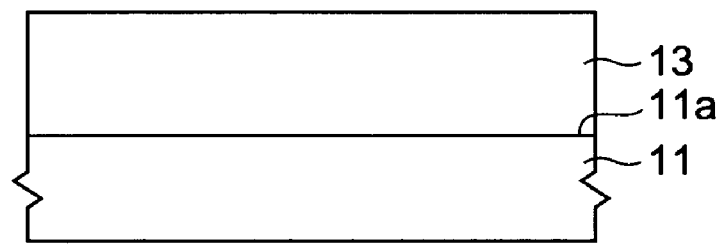
(c)
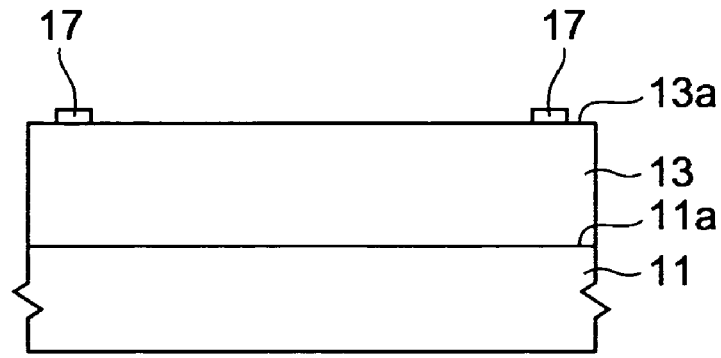

Fig.2
(a)
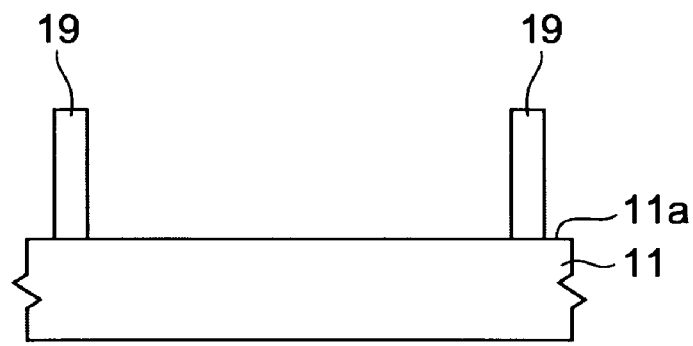
(b)
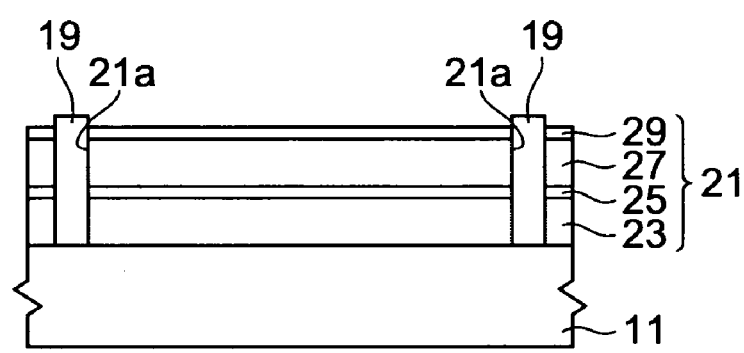
(c)
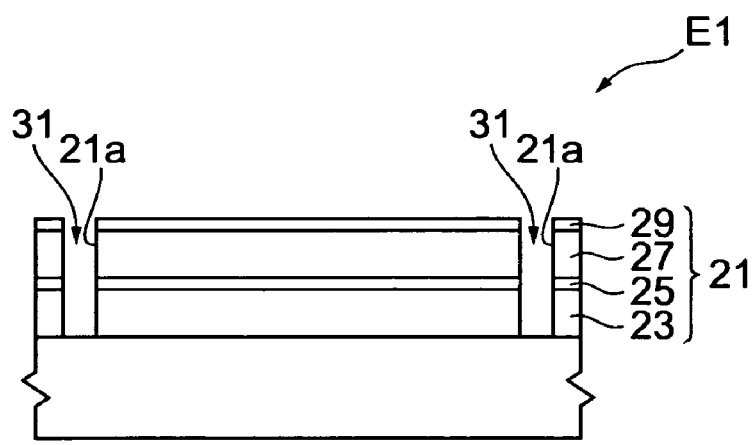

Fig.3
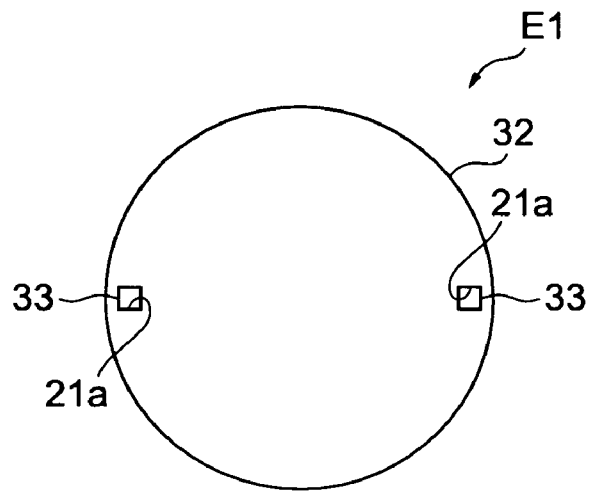
(a)
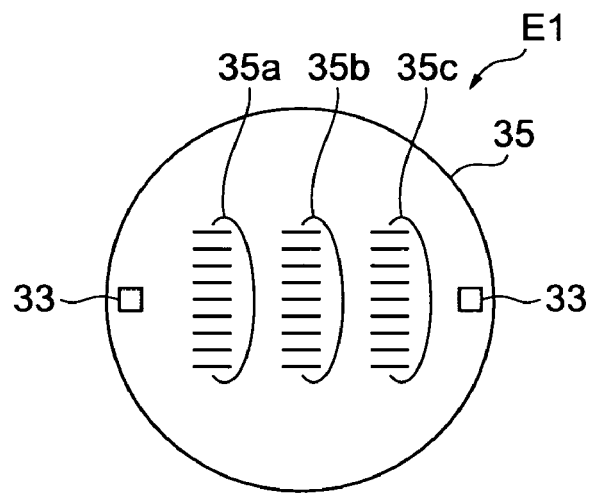
(b)
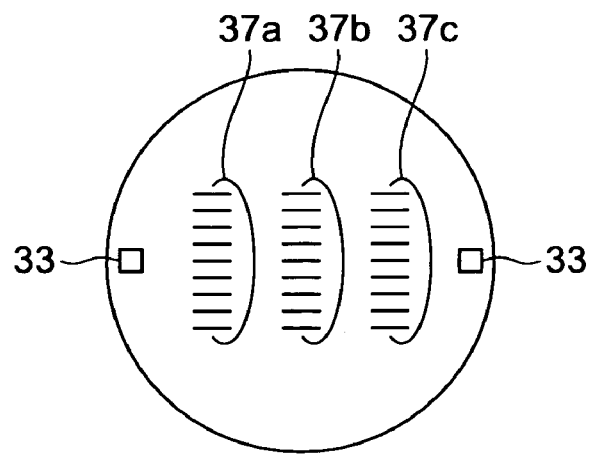
(c)

Fig.4
(a)
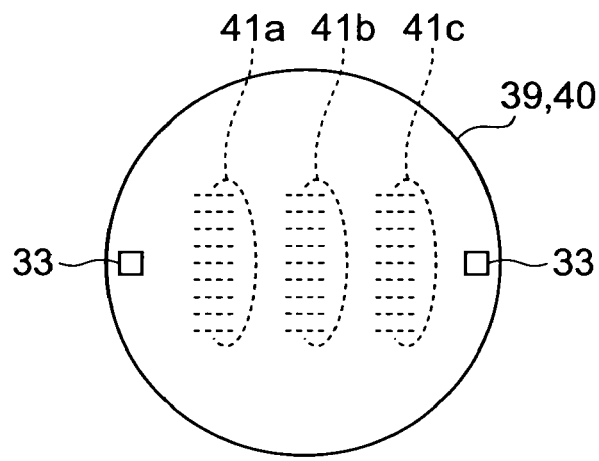
(b)
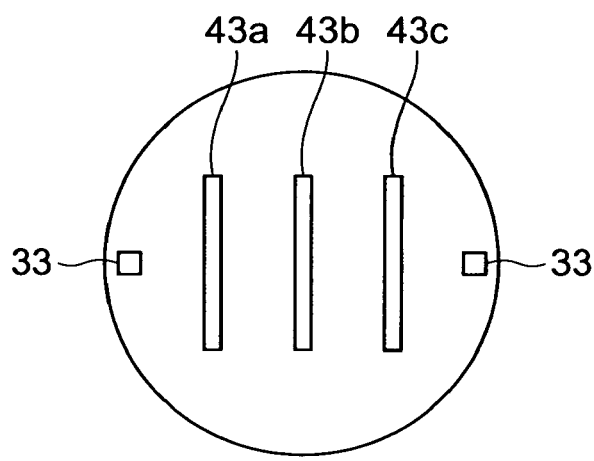
(c)
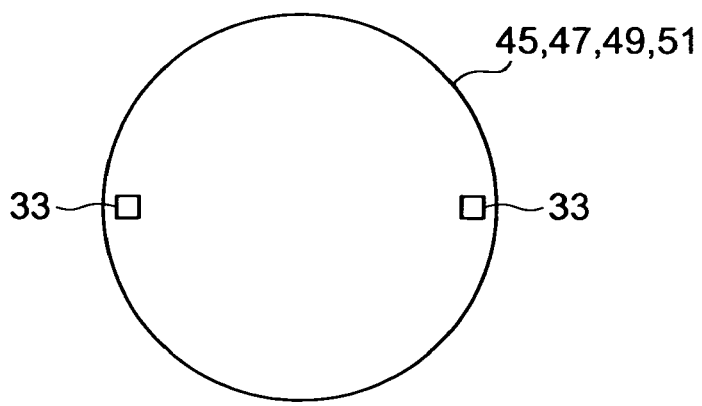

Fig.6
(a)
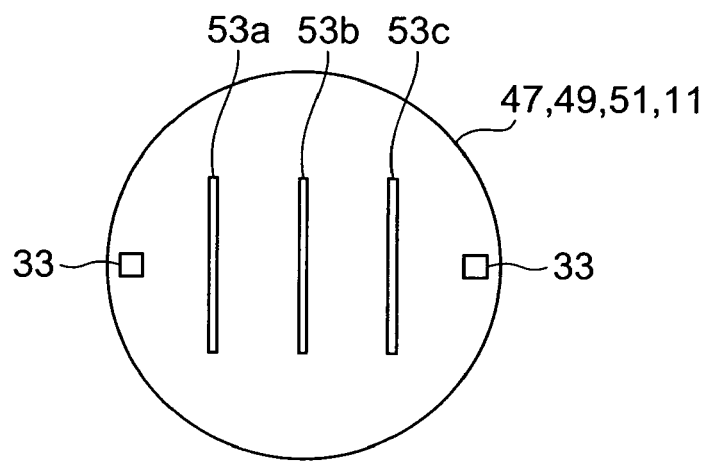
(b)
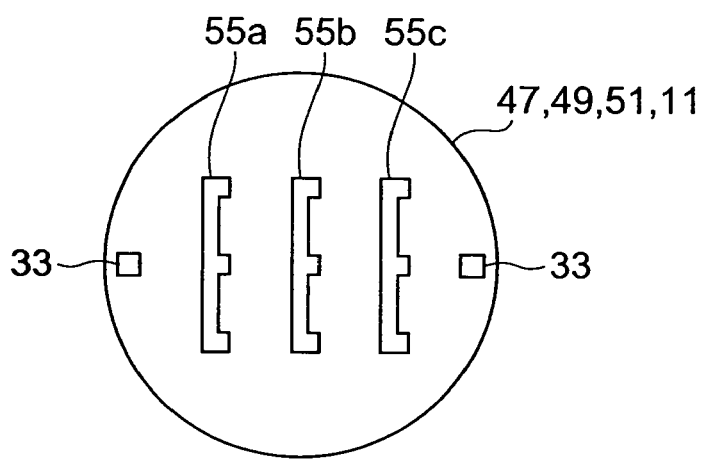
(c)
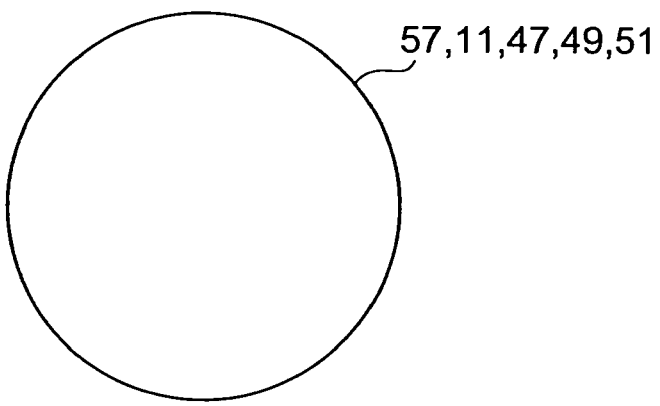

METHOD OF FABRICATING SEMICONDUCTOR OPTICAL DEVICE

BACKGROUND OF THE INVENTION

1. Field of the Invention

The present invention relates to a method of fabricating a semiconductor optical device.

2. Related Background Art

Publication 1 (Japanese Patent Application Laid Open No. H10-64781) discloses a method of making an alignment mark on a substrate. In this method, a part of the semiconductor is etched to form a pattern for forming the alignment mark. A semiconductor crystal is selectively grown on the pattern to form the alignment mark. Semiconductor films differing in thickness and composition are deposited on the same substrate in the selective growth of semiconductor for making a semiconductor integrated optical device, and this method provides the easy formation of alignment marks which facilitate the alignment.

SUMMARY OF THE INVENTION

When alignment marks are formed by wet-etching a part of the surface of a compound semiconductor substrate, electron beam exposure apparatuses cannot detect them very well. When alignment marks are formed by dry-etching a part of the surface of a compound semiconductor substrate, this process may degrade the reliability of the semiconductor optical devices and this degradation should be avoided in order to obtain the good reliability thereof.

It is an object to provide a method of fabricating a semiconductor optical device, and this method provides an excellent alignment in the step of the direct writing of a pattern for a diffraction grating of the semiconductor optical device by use of electron beam exposure apparatuses.

One aspect of the present invention is a method of fabricating a semiconductor optical device. The method comprises the steps of: forming insulating structures for an alignment mark for use in electron beam exposure on a primary surface of a first group III-V semiconductor region; after forming the insulating structures, growing a second group III-V semiconductor region on the first group III-V semiconductor region to form an epitaxial wafer; after growing the second group III-V semiconductor region, performing alignment for the electron beam exposure; and after the alignment, exposing a resist to an electron beam to form a resist mask having a pattern for a diffraction grating. The resist is provided on the epitaxial wafer. The height of the insulating structures is larger than thickness of the second group III-V semiconductor region.

In the method according to the present invention, the method further comprises the step of, after growing the second group III-V semiconductor region and prior to the alignment, forming depressing in the second group III-V semiconductor region by removing the insulating structures.

In the method according to the present invention, the alignment in the electron beam exposure may be performed by use of these depressions. Steps are provided by the edges of the depressions.

In the method according to the present invention, the alignment in the electron beam exposure may be performed without removing the insulating structures. Steps are provided by the edges of the insulating structures.

In the method according to the present invention, each of the insulating structures has a post-like shape and has a side extending in a direction intersecting with the primary surface of the first group III-V semiconductor region.

In the method according to the present invention, the method further comprises the steps of: depositing an insulating layer on the first group III-V semiconductor region; and etching the insulating layer to form the insulating structures.

In the method according to the present invention, the insulating structures may be arranged to form the alignment mark.

In the method according to the present invention, the insulating layer may be formed in a single deposition step. Alternatively, the insulating layer may be formed by depositing a number of insulating films.

In the method according to the present invention, the insulating layer may be formed by induction-coupled plasma method. In the method according to the present invention, the thickness of the insulating layer may be equal to or more than two micrometers.

In the method according to the present invention, the method further comprises the steps of: etching the second group III-V semiconductor region by use of the resist mask to form a periodic structure for the diffraction grating in the second group III-V semiconductor region; and forming a third group III-V semiconductor region over the periodic structure of the second group III-V semiconductor region. In the method according to the present invention, the third group III-V semiconductor region may include an active layer.

In the method according to the present invention, the second group III-V semiconductor region may include an active layer. Alternatively, in the method according to the present invention, the third group III-V semiconductor region may include an active layer.

In the method according to the present invention, the insulating layer may be made of silicon inorganic compound. In the method according to the present invention, the silicon inorganic compound may be silicon oxide.

BRIEF DESCRIPTION OF THE DRAWINGS

The above object and other objects, features, and advantages of the present invention will be understood easily from the following detailed description of the preferred embodiments of the present invention with reference to the accompanying drawings.

FIG. 1 is a schematic view showing cross sections of substrate products in primary steps in the method of fabricating a semiconductor optical device according to the present invention.

FIG. 2 is a schematic view showing cross sections of substrate products in primary steps in the method of fabricating the semiconductor optical device.

FIG. 3 is a schematic view showing top surfaces of substrate products in primary steps in the method of fabricating the semiconductor optical device.

FIG. 4 is a schematic top view showing top surfaces of substrate products in primary steps in the method of fabricating the semiconductor optical device.

FIG. 6 is a schematic view showing top surfaces of substrate products in primary steps in the method of fabricating the semiconductor optical device.

DETAILED DESCRIPTION OF THE PREFERRED EMBODIMENTS

Figure 5:
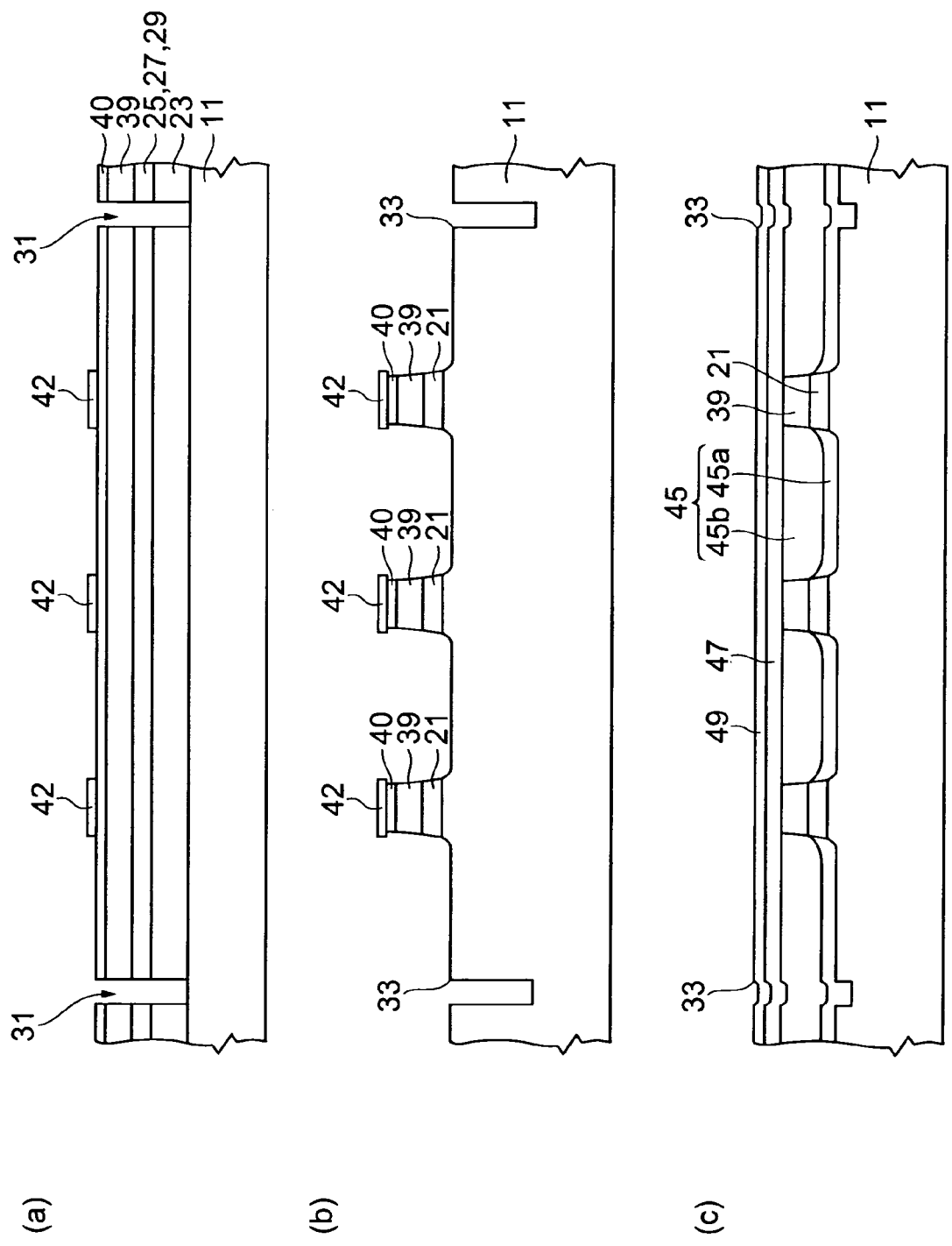
FIG. 5 is a schematic view showing cross sections of substrate products in primary steps in the method of fabricating the semiconductor optical device.

The teaching of the present invention will readily be understood in view of the following detailed description with reference to the accompanying drawings illustrated by way of example. Referring to the accompanying drawings, embodiments of a method of fabricating a semiconductor optical device of the present invention will be explained. When possible, parts identical to each other will be referred to with symbols identical to each other.

FIGS. 1 to 6 are schematic views explaining primary steps in the method of fabricating a semiconductor optical device. In the following, the method of fabricating a distributed feedback (DBF) semiconductor laser will be explained as an example of the semiconductor optical device.

As shown in part (a) of FIG. 1, a substrate, such as InP substrate 11, is prepared, and semiconductor layers are grown thereon. The InP substrate 11 is one of available group III-V compound semiconductor substrates, and provides a group III-V compound semiconductor region used as a base on which semiconductor layers are deposited. In the subsequent explanation, the InP substrate 11 is referred to as the substrate, but the substrate available for the present invention is not limited thereto. Other semiconductor substrates, such as GaAs substrate and GaN substrate, can be used as the substrate.

As shown in part (b) of FIG. 1, an insulating layer 13 is formed on the primary surface 11a of the InP substrate 11. The thickness of the insulating layer 13 is larger than that of the group III-V compound semiconductor region, for example semiconductor layers, that is made in the following step, and in a preferred example, the insulating layer 13 can be made of silicon inorganic compound, aluminum inorganic compound and so on. The silicon inorganic compound can be silicon compound including at least one of oxygen and nitrogen, such as silicon oxide (for example, $SiO_2$) and silicon nitride (for example, SiN). The aluminum inorganic compound can be aluminum oxide (for example, $Al_2O_3$). When the insulating layer 13 is made of silicon oxide, it is preferable to use a silicon oxide film formed by induction coupled plasma chemical vapor deposition (ICP-CVD) method. The ICP-CVD method permits the formation of low-stressed silicon oxide layers and thus can provide a thick silicon oxide layer which can be used for the insulating layer 13. Further, it is advantageous that the insulating layer 13 of a low-stressed silicon oxide layer formed on a substrate reduces the stress that is applied to the substrate. Furthermore, the insulating layer 13 can be made of a thick single film, thereby avoiding the repetition of film formations An example of the growth recipes of ICP-CVD is as follows:

Gas for depositing film: Tetra Ethyl Ortho Silicate (TEOS)

Flow rate of TEOS: 10 sccm

Flow rate of $O_2$: 100 sccm

RF power for generating plasma: 1000 watts

RF power for adjusting refractive index: 0 to 300 watts

Pressure: 5 Pa

Substrate temperature: 400 degrees Celsius or lower

Deposition rate: 300 nm/min.

The ICP-CVD method permits the formation of $SiO_2$ films of thickness up to about 5 micrometers.

For example, when the thickness of the insulating layer 13 is equal to or more than two micrometers, the top of the insulating layer 13 is higher than the top surface of the semiconductor layers that is grown in the subsequent growth step.

As shown in part (c) of FIG. 1, a mask 17 is formed on the insulating layer 13. The mask 17 has the pattern that is transferred to a mark for use in alignment in electron beam exposure (hereinafter referred to as "EB exposure") of the subsequent steps. The mask 17 is made of, for example, resist, and is patterned by photolithography.

As shown in part (a) of FIG. 2, the insulating layer 13 is etched using the mask 17. This etching may be dry etching, for example, and selectively remove a part of the insulating layer 13 to form a number of insulating structures 19 provided on the primary surface of the substrate 11. Each of the insulating structures 19 has a shape preferable for the alignment in the EB exposure step. For example, the insulating structures 19 are arranged at the reference position for alignment in the EB exposure step, and are shaped like a post, for example.

As shown in part (b) of FIG. 2, a group III-V compound semiconductor region is formed on the primary surface 11a of the substrate 11 after forming the insulating structures 19. In the present example, the group III-V compound semiconductor region can be a laminated region 21. The laminated region 21 has a side 21a, and the side 21a is in contact with the side of each of the insulating structures 19. The laminated region 21 includes a number of group III-V compound semiconductor layers 23, 25, 27 and 29, and these layers 23, 25, 27 and 29 are sequentially stacked on the substrate 11. It is preferable that these group III-V compound semiconductor layers 23, 25, 27 and 29 be grown by metal-organic-vapor-phase epitaxy (MOVPE). The group III-V compound semiconductor layers 23, 25, 27 and 29 are selectively grown on the substrate, and are not grown on the surface of the insulating mask. The group III-V compound semiconductor layer 23 is provided for a first conductive type cladding layer, and the first conductive type cladding layer is made of, for example, n-type InP. The group III-V compound semiconductor layer 25 is provided for a first optical guide layer, and the first optical guide layer is made of, for example, n-type GaInAsP. The group III-V compound semiconductor layer 27 is provided for an active layer of the semiconductor optical device, and the structure of the active layer may be a bulk, single quantum well or multiple quantum well. The group III-V compound semiconductor layer 29 is provided for a second optical guide layer, and the second optical guide layer is made of, for example, p-type GaInAsP. In the present embodiment, crystal growth for the active layer is carried out before the EB exposure step, and the diffraction grating is formed on the second optical guide layer.

If required, as shown in part (c) of FIG. 2, the insulating structures 19 may be removed, and wet etching can be used for this removal. When the insulating structures 19 are made of silicon oxide, the silicon oxide insulating structures can be selectively removed by hydrofluoric acid and so on, and the laminated region 21 made of group III-V compound semiconductor is not removed thereby. The insulating structures 19 are formed before depositing the laminated region 21, and after depositing the laminated region 21, the insulating structures 19 are removed to form an epitaxial wafer E1. The laminated region 21 in the epitaxial wafer E1 is provided with a number of depressions formed by the removal of the insulating structures 19 without etching semiconductor. The formation and removal of the insulating structures 19 permits the formation of the steps 33 that are located at the edges of depressions 31. The steps 33 are independent of crystal orientation of the laminated region 21. The epitaxial wafer E1 includes the depressions 31, e.g., empty holes, in the laminated region 21. Each of the depressions 31 has a side 21a, and the side 21a extends in a direction intersecting with the top surface of the laminated region 21. The side has steep edges, and for example, the side is approximately perpendicular to the top surface of the laminated region 21.

After forming the laminated region 21, alignment in the EB exposure step is performed. Prior to the alignment, as shown in part (a) of FIG. 3, resist is applied onto the surface of the laminated region 21 to form a resist film 32. The alignment of EB exposure is performed by use of the steps 33 (depressions 31). Two squares are drawn in part (a) of FIG. 3 to show the steps 33 (depressions 31) as a representative example.

In the above steps, since the height of the insulating structures 19 is greater than the thickness of the laminated region 21, the selective removal of the insulating structures 19 with respect to the laminated region 21 can be performed even after the laminated region 21 has been formed. The empty holes formed by the above selective removal can be used as alignment marks for the alignment of EB exposure. Therefore, as shown in part (b) of FIG. 3, the appropriate alignment can be performed by using the depressions 31 as alignment marks, and a mask 35 made of resist is formed on the epitaxial wafer E1 by EB exposure and development. The mask 35 has patterns 35a, 35b and 35c for a diffraction grating, for example.

As shown in part (c) of FIG. 3, the laminated region 21 is etched using the patterned mask 35. After this etching, the mask 35 is removed. After the etching and removal, periodic structures 37a, 37b and 37c for the diffraction grating is formed in the laminated region 21.

As shown in part (a) of FIG. 4, a group III-V compound semiconductor 39 is grown so as to cover the structures 37a, 37b and 37c. In this step, diffraction gratings 41a, 41b and 41c have formed using the mask 35 patterned by the appropriate alignment. The group III-V compound semiconductor 39 can be a second conductive type cladding layer, and the second conductive type cladding layer is made of, for example, p-type InP. A group III-V compound semiconductor 40 is grown on the group III-V compound semiconductor 39. The group III-V compound semiconductor 40 can be a second conductive type capping layer, and the second conductive type capping layer is made of, for example, p-type GaInAs.

Next, as shown in part (b) of FIG. 4, mesa waveguide structures 43a, 43b and 43c are formed, and each of the mesa waveguide structures 43a, 43b and 43c includes the part of the laminated region 21 and group III-V compound semiconductors 39, 40. An insulating film of silicon oxide or silicon nitride is formed onto the group III-V compound semiconductor 40. The insulating film is made of silicon oxide or silicon nitride such as SiO.sub.2 or SiN, for example, and the silicon oxide and silicon nitride can be formed by plasma chemical vapor deposition (CVD) method. Silane and oxygen can be used as source gas for forming the silicon oxide, and silane and nitrogen can be used as source gas for forming the silicon nitride. The thickness of the insulating film is about 0.1 micrometers. Then, resist is applied onto the insulating film. After the application of the resist, a pattern of a mask for forming the mesa waveguide structures 43a, 43b and 43c is transferred to the resist. The pattern that is the same as that of the resist mask for forming the mesa waveguide structures 43a, 43b and 43c is transferred to the insulating film by using the resist as the mask. Then, the resist is removed. As shown in part (a) of FIG. 5, a mask 42 made of the insulating film is formed on the group III-V compound semiconductor 40. Since the pattern for forming the mesa waveguide structures 43a, 43b and 43c should be positioned to the diffraction gratings 41a, 41b and 41c, the alignment in the patterning step can be performed by use of the steps 33 again. As shown in part (b) of FIG. 5, the mesa waveguide structures 43a, 43b and 43c are formed by wet etching using the mask 42 of insulating material. The etchant of Br-methanol can be used in this wet etching process. Each of the mesa waveguide structures 43a, 43b and 43c includes the diffraction gratings 41a, 41b and 41c and the part of the semiconductor laminated region 21 containing the active layer. Alternatively, before the above wet etching process, an insulating layer may be formed on alignment mask areas in the laminated region 21 to cover the surfaces of the alignment marks. In the wet etching process, the depressions 31 in the alignment mask areas are not etched, and remain unchanged.

As shown in part (c) of FIG. 4, a burying layer 45 is selectively grown on the substrate 11 by MOVPE, and the burying layer 45 cover the sides of the mesa waveguide structures 43a, 43b and 43c. The burying layer 45 is not grown on the insulating film located on the mesa waveguide structures 43a, 43b and 43c. For example, InP semiconductor is formed in this burying regrowth step. As shown in part (c) of FIG. 5, the burying layer 45 includes p-type InP layer 45a and n-type Inp layer 45b. After the burying regrowth, another second conductive type semiconductor cladding layer 47 and a second conductive type semiconductor contact layer 49 are grown by MOVPE on the substrate 11. These layers 47 and 49 are formed on the mesa waveguide structures 43a, 43b and 43c and the burying layer 45. The second conductive type semiconductor cladding layer 47 is made of, for example, p-type InP, and the second conductive type semiconductor contact layer 49 is made of, for example, p-type GaInAs.

Referring to part (c) of FIG. 4 again, an insulating film 51 is formed on the second conductive type semiconductor contact layer 49. The insulating film 51 is made of, for example, silicon oxide, and silicon oxide can be formed by plasma CVD method. The thickness of the insulating film 51 is about 0.1 micrometers.

As shown in part (a) of FIG. 6, windows 53a, 53b, 53c are formed in the insulating film 51, and the top surface of the second conductive type semiconductor contact layer 49 is exposed in the windows 53a, 53b, 53c. The alignment to form the windows 53a, 53b, 53c can be performed by use of the steps 33 such that the windows 53a, 53b, 53c are located on the mesa waveguide structures 43a, 43b and 43c, respectively.

Next, as shown in part (b) of FIG. 6, first electrodes 55a, 55b, 55c are formed so as to cover the windows 53a, 53b, 53c, respectively. These first electrodes 55a, 55b, 55c, are provided for, for example, the anode electrodes of semiconductor lasers.

After backgrinding the substrate 11 to reduce its thickness to a desired value, as shown in part (c) of FIG. 6, a second electrode 57 is formed on the backside of the processed substrate. The second electrode 57 is provided for, for example, the cathode electrode of the DFB semiconductor laser.

In the present embodiment described above, the insulating structures 19 are removed to form depressions 31, e.g. holes, in the laminated region 21. In a modified embodiment according to the present invention, the alignment of EB exposure is performed without removing the insulating structures 19. Although the laminated region 21 is formed after forming the insulating structures 19, the laminated region 21 is not grown on the insulating structures 19 and the steps are provided by the edges of the insulating structures 19. Since the height of the insulating structures 19 is greater than the thickness of the laminated region 21, the insulating structures 19 protruding from the laminated region 21 can be also used as alignment marks for use in EB exposure, and provides the excellent accuracy of the alignment for EB exposure. This method can be used to form a resist mask of a pattern for diffraction gratings. By use of this EB exposure method, the array of the diffraction gratings is also formed on the epitaxial wafer.

In the above embodiments, the diffraction gratings are formed after growing the active layer, but the diffraction gratings may be formed before growing the active layer.

As explained above, the method in the above embodiment Permits the formation of the alignment mark that can provides the easy detection and accurate alignment in the EB exposure step.

Having described and illustrated the principle of the invention in a preferred embodiment thereof, it is appreciated by those having skill in the art that the invention can be modified in arrangement and detail without departing from such principles. For example, the InP-based buried DFB semiconductor laser having a one-dimensional diffraction grating, but the application of present invention is not limited to the specific examples disclosed in the embodiment. The present invention is applicable to methods of making electronic devices, such as other type DFB lasers and distributed reflector (DR) lasers, using EB exposure. Further, the insulating layer is formed in the single deposition in the embodiments, but a number of thin insulating films can be repeatedly deposited to form the insulating layer. Details of devices and steps of the method can be modified as necessary. We therefore claim all modifications and variations coming within the spirit and scope of the following claims.

What is claimed is:

1. A method of fabricating a semiconductor optical device, the method comprising the steps of:
   forming insulating structures for an alignment mark for use in electron beam exposure on a primary surface of a first group III-V semiconductor region;
   after forming the insulating structures, growing a second group III-V semiconductor region on the first group III-V semiconductor region to form an epitaxial wafer, a height of the insulating structures being larger than a thickness of the second group III-V semiconductor region;
   after growing the second group III-V semiconductor region, performing alignment in the electron beam exposure; and
   after the alignment, exposing a resist to an electron beam to form a resist mask having a pattern for a diffraction grating, the resist being provided on the epitaxial wafer.

2. The method according to claim 1, the method further comprising the step of, after growing the second group III-V semiconductor region and prior to the alignment, forming depressions in the second group III-V semiconductor region by removing the insulating structures.

3. The method according to claim 2, wherein the alignment in the electron beam exposure is performed by use of the depressions.

4. The method according to claim 1, wherein the alignment in the electron beam exposure is performed without removing the insulating structures.

5. The method according to claim 1, wherein each of the insulating structures has a side, and the side extends in a direction intersecting with the primary surface of the first group III-V semiconductor region.

6. The method according to claim 1, wherein the second group III-V semiconductor region includes an active layer.

7. The method according to claim 2, wherein the second group III-V semiconductor region includes an active layer.

8. The method according to claim 4, wherein the second group II-V semiconductor region includes an active layer.

9. The method according to claim 1, the method further comprising the steps of:
   depositing an insulating layer on the first group III-V semiconductor region; and
   etching the insulating layer to form the insulating structures.

10. The method according to claim 9, wherein the insulating layer is formed in a single deposition step.

11. The method according to claim 9, wherein the insulating layer is forming by depositing a number of insulating films.

12. The method according to claim 9, wherein the insulating layer is formed by induction-coupled plasma method.

13. The method according to claim 12, wherein thickness of the insulating layer is equal to or more than two micrometers.

14. The method according to claim 1, the method further comprising the steps of:
   etching the second group III-V semiconductor region by use of the resist mask to form a periodic structure for the diffraction grating in the second group III-V semiconductor region; and
   forming a third group III-V semiconductor region over the periodic structure of the second group III-V semiconductor region.

15. The method according to claim 2, the method further comprising the steps of:
   etching the second group III-V semiconductor region by use of the resist mask to form a periodic structure for the diffraction grating in the second group III-V semiconductor region; and
   forming a third group III-V semiconductor region over the periodic structure of the second group III-V semiconductor region.

16. The method according to claim 4, the method further comprising the steps of:
   etching the second group III-V semiconductor region by use of the resist mask to form a periodic structure for the diffraction grating in the second group III-V semiconductor region; and
   forming a third group III-V semiconductor region over the periodic structure of the second group III-V semiconductor region.

17. The method according to claim 14, wherein the third group III-V semiconductor region includes an active layer.

18. The method according to claim 2, wherein the depressions are arranged to form the alignment mark.

19. The method according to claim 4, wherein the insulating structures are arranged to form the alignment mark.

20. The method according to claim 1, wherein the insulating layer is made of silicon oxide.

* * * * *